United States Patent
Lepori et al.

(10) Patent No.: US 8,450,140 B2
(45) Date of Patent: May 28, 2013

(54) METHOD FOR LARGE-SCALE MANUFACTURING OF PHOTOVOLTAIC CELLS FOR A CONVERTER PANEL AND PHOTOVOLTAIC CONVERTER PANEL

(75) Inventors: Daniel Lepori, Castagnola (CH); Tobias Roschek, Alt St. Johann (CH); Ulrich Kroll, Corcelles (CH)

(73) Assignee: TEL Solar AG, Truebbach (CH)

( * ) Notice: Subject to any disclaimer, the term of this patent is extended or adjusted under 35 U.S.C. 154(b) by 204 days.

(21) Appl. No.: 12/999,236

(22) PCT Filed: Jun. 18, 2008

(86) PCT No.: PCT/EP2008/057716
§ 371 (c)(1),
(2), (4) Date: Dec. 15, 2010

(87) PCT Pub. No.: WO2009/152854
PCT Pub. Date: Dec. 23, 2009

(65) Prior Publication Data
US 2011/0108109 A1    May 12, 2011

(51) Int. Cl.
*H01L 21/00* (2006.01)
*H01L 21/20* (2006.01)
*H01L 21/36* (2006.01)

(52) U.S. Cl.
USPC ............. 438/97; 438/482; 438/488; 438/761; 257/E25.009; 257/E23.134

(58) Field of Classification Search
USPC ................ 438/97, 482, 488, 761, FOR. 393, 438/FOR. 394; 257/E25.009, E23.134
See application file for complete search history.

(56) References Cited

U.S. PATENT DOCUMENTS

| 4,379,943 | A | * | 4/1983 | Yang et al. ............... 136/249 |
| 5,066,340 | A | | 11/1991 | Iwamoto |
| 6,309,906 | B1 | | 10/2001 | Meier et al. |
| 2004/0149988 | A1 | | 8/2004 | Shiozaki |
| 2005/0028860 | A1 | | 2/2005 | Sano |
| 2008/0057220 | A1 | * | 3/2008 | Bachrach et al. ............ 427/569 |

FOREIGN PATENT DOCUMENTS

| EP | 0871979 | 10/1998 |
| EP | 0871979 | 6/2006 |

OTHER PUBLICATIONS

Written Opinion of the International Searching Authority of International Application No. PCT/EP2008/057716.
Menno N. Van Den Donker: Plasma Deposition of Microcrystalline Silicon Solar Cells: Looking Beyond the Glass, Energy Technology, vol. 57.
Mai et al, Microcrystalline Silicon Solar Cells Deposited at High Rates by Combination of VHF-PECVD and High Working Pressure.

* cited by examiner

*Primary Examiner* — Michelle Mandala
(74) *Attorney, Agent, or Firm* — Notaro, Michalos & Zaccaria P.C.

(57) ABSTRACT

So as to improve large-scale industrial manufacturing of photovoltaic cells and of the respective converter panels at a photovoltaic cell with a microcrystalline layer of intrinsic silicon compound at least one of the adjacent layers of doped silicon material is conceived as a an amorphous layer.

9 Claims, 3 Drawing Sheets

Figure 1:
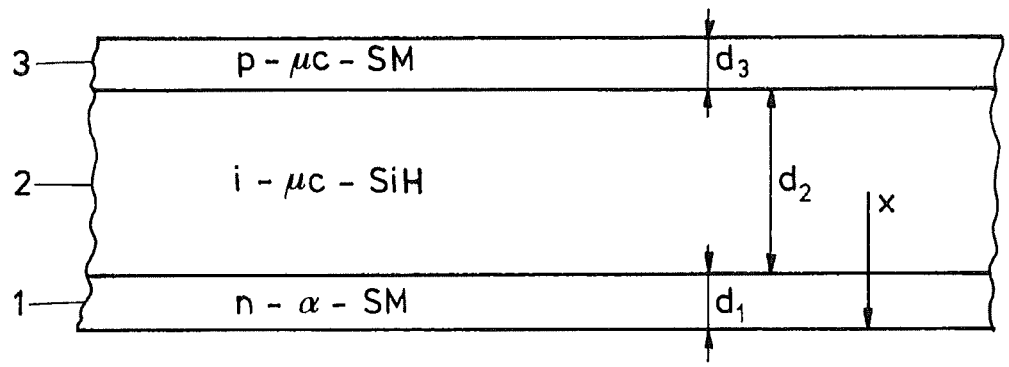

METHOD FOR LARGE-SCALE MANUFACTURING OF PHOTOVOLTAIC CELLS FOR A CONVERTER PANEL AND PHOTOVOLTAIC CONVERTER PANEL

The present invention is directed to a method for large-scale industrial manufacturing of photovoltaic cells for a photovoltaic converter panel of at least 2500 cm$^2$ surface extent and to a photovoltaic converter panel at least of the addressed surface extent.

DEFINITIONS

Microcrystalline layer:
We understand under a "microcrystalline layer" throughout the present description and claims a layer with the following characteristics:
  Having a thickness, averaged over its surface extent, of at most 10 μm;
  Having a content of at most 50 vol. % amorphous material averaged along its surface extent;
  Comprising crystals with a crystal diameter perpendicular to direction of growth of less than 1 μm.
Amorphous layer:
We understand under an "amorphous layer" throughout the present description and claims a layer with the following characteristics:
  More than 50 vol. %, averaged along its surface extent, is amorphous.
We understand under the term "neutrally doped material" a material which is doped to establish the material to have a mutually at least approximately compensated doping, approximately in the sense that remaining excess doping is neglectable in context of photovoltaic cell technique.
We understand under the term "undoped material" intrinsic material.
As at present moment it is preferred to realise the addressed "neutrally doped or undoped" materials as undoped materials. Therefore we will refer in the following description to "intrinsic" material-i-.
Photovoltaic cell:
We understand under a photovoltaic cell a semiconductor layer structure of positive—p-intrinsic—i- and negative—n-doped layers, thereby p-i-n or n-i-p, wherein sunlight or at least a part of sunlight spectrum—be it in the visible or in the invisible spectral range—is transmitted to the i-layer which is responsible for photovoltaic absorption.
A layer is "substantially" of a material:
By this formulation we address that the material may comprise elements for selectively tailoring its characteristics e.g. with respect to spectral transmission of sunlight.
Type of doping
A semiconductor material may be positively—p- or negatively—n-doped. We address these doping possibilities by the term "type".
We understand under a "vacuum deposition process in an atmosphere containing a reactive gas" a vacuum deposition process, e.g. CVD (chemical vapor deposition), thereby PECVD (plasma enhanced CVD), PVD (physical vapor deposition) whereat a gaseous phase materially contributes to the material being deposited. In this context a resulting "compound" material being deposited by such process reflects such contribution.
We understand under the term that layers are "integral", that the material matrix of the layers establishes for a single layer, the two layers being only recognizable by one or more than one elements of the material being different. Transition from one to the other layer may be steadily or step-like.

Photovoltaic cells using a microcrystalline layer of intrinsic semiconductor material, thereby especially microcrystalline layers substantially of intrinsic hydrogenated silicon, are subject of increased scientific and commercial interest. Thereby often respective publications refer to the material being microcrystalline instead of the layer being microcrystalline depending on the respective definition. Clearly a layer of such microcrystalline material as presented in various publications for photovoltaic cells establishes for a microcrystalline layer according to the definition as used in the present context.

Early reports about experiments with microcrystalline layers of intrinsic hydrogenated silicon for photovoltaic cells revealed that, especially when such layers were deposited by CVD (chemical vapor deposition) including PECVD (plasma-enhanced CVD), they become involuntarily negatively doped. This led to the conclusion that such layers are of no or at least very restricted interest for the addressed photovoltaic cell applications.

This involuntary negative doping phenomenon, especially when CVD- thereby PECVD-depositing microcrystalline layers of hydrogenated silicon, was subsequently remedied by compensating the involuntary negative doping by voluntarily adding a positive dopant leading to roughly neutrally doped material. The result of such an approach was, that microcrystalline layers of hydrogenated silicon became subject of scientific interest for photovoltaic active layers of photovoltaic cells.

Then and according to the EP 0 871 979 which accords with the U.S. Pat. No. 6,309,906 it was found that one important origin of the addressed involuntary negative doping is spurious oxygen in the processing atmosphere during deposition of the microcrystalline layer of hydrogenated silicon. Thus and according to the addressed reference, by making use of a highly purified reactive gas, especially of highly purified Silane, and by accurately cleaning and conditioning the vacuum recipient before layer deposition, the resulting microcrystalline layer of hydrogenated silicon became intrinsic substantially without any spurious doping to be compensated.

Thus and according to the addressed EP 0 871 979 a photovoltaic cell became known, whereat the overall p-i-n or n-i-p layer system establishing for the cell consists of microcrystalline layers of hydrogenated silicon.

Thereby and according to the knowledge of the inventors of the present invention it became for the first time possible to industrially exploit microcrystalline layers of a silicon compound, namely of hydrogenated silicon, as photovoltaically active layers for solar cells and respective converter panels.

Aspects which become now of significant interest and importance are large scale processing considerations as of process stability, processing costs to which throughput and thus processing time for the addressed photovoltaic cells and panel considerably contribute as well as power consumption.

Under this aspect it is an object of the present invention to improve large-scale industrial manufacturing of photovoltaic cells for photovoltaic converter panels of at least 2500 cm$^2$ which cells comprise, as a photovoltaically active layer, a microcrystalline layer substantially of silicon compound.

This object is resolved by the method according to the present invention which comprises depositing a first layer substantially of first type doped semiconductor material by means of a vacuum deposition process, depositing a third layer substantially of second type doped semiconductor material by means of a vacuum deposition process, and, in between as a second layer, depositing by means of a vacuum deposition process in an atmosphere containing at least one reactive gas a neutrally doped or undoped microcrystalline layer substantially of silicon compound, wherein at least one of depositing the first layer and of depositing of the third layer comprises depositing of an amorphous layer of respectively doped semiconductor material.

Thereby, it has been recognized that, at least for CVD- or PECVD-layer deposition, the deposition rate of doped amorphous semiconductor material is substantially higher than the deposition rate of equally doped microcrystalline semiconductor material, that process stability for depositing such amorphous layers is significantly less critical than for depositing respective microcrystalline layers, that power consumption for deposition of the addressed amorphous layers is significantly lower than for depositing respective microcrystalline layers at equal deposition rates. Thus replacing at least one of the doped microcrystalline layers as known from prior art by a respectively doped amorphous layer according to the present invention results in a considerable improvement in large-scale industrial manufacturing of photovoltaic cells and thus of respective photovoltaic converter panels.

In "Microcrystalline Silicon Solar Cells Deposited at High Rates by Combination of VHF-PECVD and High Working Pressure", Y. Mai et al., which was published under http://www.fz-juelich.de/ief/ief-5//pdf/EPVSEC%20Paris,2004/3CO7.1-Mai%2 and was published 2004 at the European conference of Photovoltaic in Paris, France on laboratory scale, solar cells of microcrystalline p-doped and intrinsic layers and with an amorphous n-doped layer, all of hydrogenated silicon using for deposition Silane as a reactive gas have been presented. The experiments reported there were performed on $10\times10$ cm$^2$ substrates with individual solar cell areas of $1\times1$ cm$^2$. This reference one hand teaches possibilities to realize such solar cells and respective panels, but it is only by the present invention that the considerable advantages of such an approach as prior-art-realized on laboratory scale for scientific investigations about conversion characteristics of such cells are recognized for large scale industrial manufacturing.

Further it may be stated, that, departing from conceiving in large scale industrial manufacturing photovoltaic cells with a microcrystalline intrinsic layer, the skilled artisan did not consider to change the type of processing during deposition of the layer stack, due to considerations about overall straight ahead processing for the stacked layers and to considerations on steadiness of material interfaces between the stacked layers.

It must be considered, that whenever positively or negatively doped amorphous semiconductor material is brought into intimate contact with a microcrystalline intrinsic layer there occurs, due to the resulting high concentration gradient of such dopant, diffusion of the dopant into the microcrystalline intrinsic material and/or that material deposited as the second one grows on the first deposited more or less steadily changing from crystallinity structure of the first deposited material to that of the secondly deposited material. Thus and as an example if a amorphous layer of n-doped semiconductor material is grown on a microcrystalline i-layer n-dopant will migrate by diffusion from the material deposited under process conditions for amorphous layer deposition into the i-layer thereby resulting in a n-doped microcrystalline interlayer and further the layer deposited under process conditions for amorphous layer deposition will grow steadily changing from microcrystallinity to amorphous, which also results in an n-doped microcrystalline interlayer. Both addressed different mechanics contribute with respective weights to formation of a microcrystalline respectively doped interlayer caused by deposition of the doped amorphous layer. Such interlayers are in fact the respectively doped layers as known as doped microcrystalline layers from the EP 0 871 979. Nevertheless and according to the present invention such layers are deposited with the advantages as outlined above for large-scale industrial manufacturing.

In spite of the fact that different silicon-compounds may be applied for growing the microcrystalline i-layer as deposited according the method of the present invention in one embodiment such compound comprises or substantially consists of hydrogenated silicon.

One embodiment of the present invention further considers so-called tandem or multiple photovoltaic cells. It is perfectly known to the skilled artisan to provide two or more photovoltaic cells electrically in series by depositing multiple p-i-n or n-i-p layer triples one upon the other. By respectively tailoring especially the intrinsic layers photovoltaic conversion of each cell may be selectively optimized for a predetermined spectral band of sunlight to be exploited. Thereby the spectral absorption characteristics of subsequent cells must be considered. As a general rule cells should be stacked in direction of transiting light in dependency of the band gap of their i-layer material, thereby considered in the addressed direction with decreasingly high bandgaps, i.e. the closer to the sun the higher the bandgap. It is e.g. known from the addressed EP 0 871 979 to provide, in direction of impinging light, first a photovoltaic cell which is of amorphous hydrogenated silicon, followed, downstream, by a cell of microcrystalline hydrogenated silicon. This, because the amorphous hydrogenated silicon has a higher bandgap than the microcrystalline hydrogenated silicon.

According to one aspect of the present invention there is addressed adding or stacking on the top and/or on the bottom of the photovoltaic cell comprising the microcrystalline layer of intrinsic silicon compound a further photovoltaic cell, whereat at least that layer which directly follows the addressed cell with the microcrystalline layer of intrinsic silicon compound as photovoltaically active layer, is of amorphous semiconductor material.

Thereby the addressed method for manufacturing according to the one aspect of the invention comprises depositing by means of a vacuum deposition process a fourth layer substantially of first type doped semiconductor material and depositing a sixth layer by means of a vacuum deposition process substantially of second type doped semiconductor material and, in between as a fifth layer, depositing by means of a vacuum deposition process a neutrally doped or an undoped semiconductor material layer. Depositing the first layer comprises the addressed depositing of an amorphous layer of the addressed first type doped semiconductor material and depositing the sixth layer—which is a part of the second cell—comprises continuing depositing of the addressed first layer by the addressed vacuum deposition process while changing the first type doping to the second type doping.

In a further embodiment of the method according to the invention, which may be combined with the embodiment just addressed, a first further layer substantially of first type doped semiconductor material is deposited by a vacuum deposition process, a further third layer substantially of second type doped semiconductor material is deposited by means of a vacuum deposition process, and, in between, a further second layer of neutrally doped or of undoped semiconductor material is deposited by means of a vacuum deposition process. Thereby depositing of the third layer comprises the addressed depositing of an amorphous layer of second type doped semiconductor material and depositing of the addressed first further layer comprises continuing depositing of the third layer by the addressed respective vacuum deposition process, while changing the second type doping to first type doping.

Thus, in fact deposition of the amorphous n- and/or p-layers upon the microcrystalline intrinsic layer of silicon compound is continued for generating a respectively p- or n-doped layer of the just adjacent cell in tandem or multiple cell architecture.

In one further embodiment of the method according to the invention, which may be combined with any embodiment addressed up to now, at least one of depositing the first layer and of depositing the third layer is performed by a vacuum deposition process in an atmosphere containing at least one reactive gas and comprises depositing a silicon compound.

Thereby in one embodiment the silicon compound as just addressed comprises or consists of hydrogenated silicon.

In a further embodiment of the method according to the invention, which may be combined with any embodiment addressed up to now, the addressed at least one layer is deposited as an amorphous, respectively doped layer comprising a silicon compound by means of a vacuum deposition process in an atmosphere containing at least one reactive gas.

Thereby in one embodiment the silicon compound as just addressed comprises or at least substantially consists of hydrogenated silicon.

In a further embodiment of the method according to the invention, which may be combined with any embodiment addressed up to now, there is generated a respectively doped microcrystalline interlayer to the addressed second layer by the deposition of the at least one amorphous layer at least substantially of respectively doped semiconductor material.

In a further embodiment of the method according to the invention, which may be combined with any embodiment addressed up to now, the at least one layer is deposited upon the second layer.

According to the present invention there is further proposed a photovoltaic converter panel of at least 2500 cm$^2$ which comprises at least one photovoltaic cell. The cell comprises a first layer which is substantially of first type doped semiconductor material, a third layer substantially of second type doped semiconductor material and, in between as a second layer, a neutrally doped or an undoped microcrystalline layer at least substantially of a silicon compound, at least one of the first and of the third layers being amorphous.

In one embodiment of the panel according to the invention the addressed silicon compound comprises or at least substantially consists of hydrogenated silicon.

In one embodiment of the panel according to the invention, which may be combined with any embodiment addressed up to now, at least one of the first and of the third layers comprises or at least substantially consists of silicon compound.

In one embodiment of the panel according to the invention, which may be combined with any embodiment addressed up to now, the silicon compound as just addressed comprises or at least substantially consists of hydrogenated silicon.

In one embodiment of the panel according to the invention, which may be combined with any embodiment addressed up to now the panel comprises at least one second photovoltaic cell stacked with the first one which was addressed to now. This second cell comprises a fourth layer substantially of first type doped semiconductor material, a sixth layer substantially of second type doped semiconductor material and, in between as a fifth layer, a layer substantially of neutrally doped or of undoped semiconductor material, wherein the first layer is amorphous and the sixth layer is integral with the first layer.

In one embodiment of the panel according to the invention, which may be combined with any embodiment addressed up to now at least one of the fourth, fifth and sixth layer comprises or at least substantially consists of silicon compound.

In one embodiment of the panel according to the invention, which may be combined with any embodiment addressed up to now, the silicon compound just addressed comprises or at least substantially consists of hydrogenated silicon.

In one embodiment of the panel according to the invention, which may be combined with any embodiment addressed up to now, the panel comprises at least one further photovoltaic cell stacked on the first cell as was addressed. This further cell comprises a first further layer at least substantially of first type doped semiconductor material, a third layer at least substantially of second type doped semiconductor material and, in between as a second further layer, a layer at least substantially of neutrally doped or of undoped semiconductor material, wherein the third layer is amorphous and the first further layer is integral with the third layer.

In one embodiment of the panel according to the invention, which may be combined with any embodiment addressed up to now, at least one of the first further layer, of the second further layer and of the third further layer comprises or at least substantially consists of silicon compound.

In one embodiment of the panel according to the invention, which may be combined with any embodiment addressed up to now, the silicon compound as just addressed comprises or at least substantially consists of hydrogenated silicon.

In one embodiment of the panel according to the invention, which may be combined with any embodiment addressed up to now the at least one layer is deposited upon the second layer.

Figure 2:
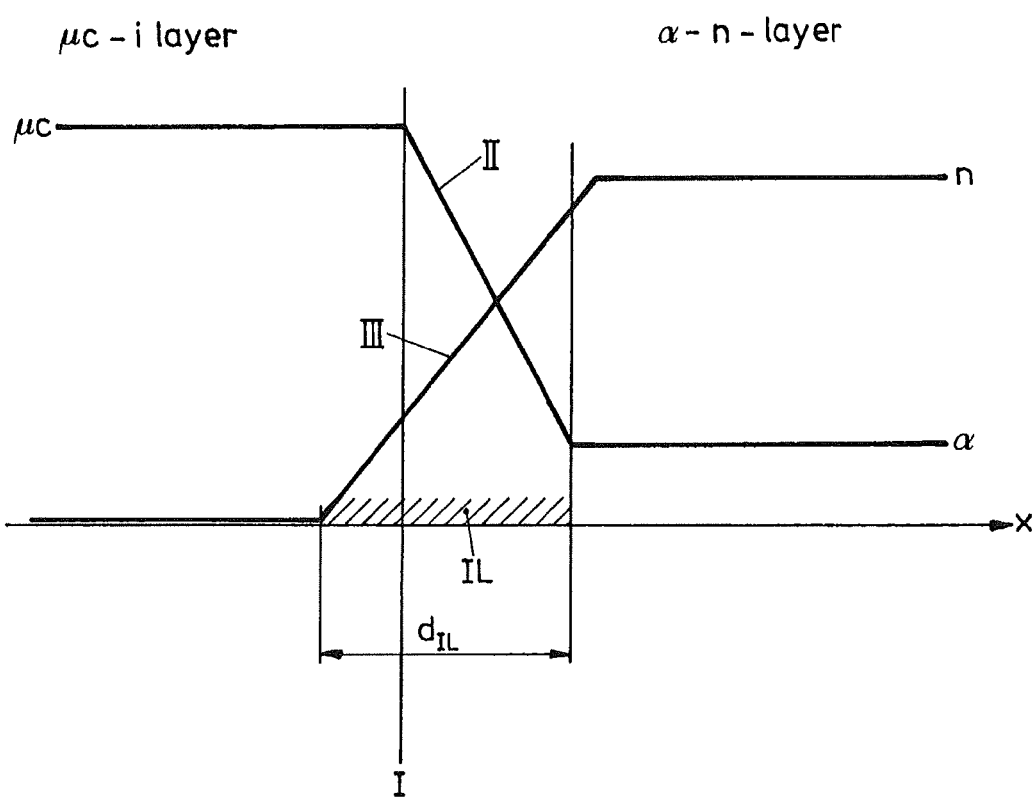
Figure 3:
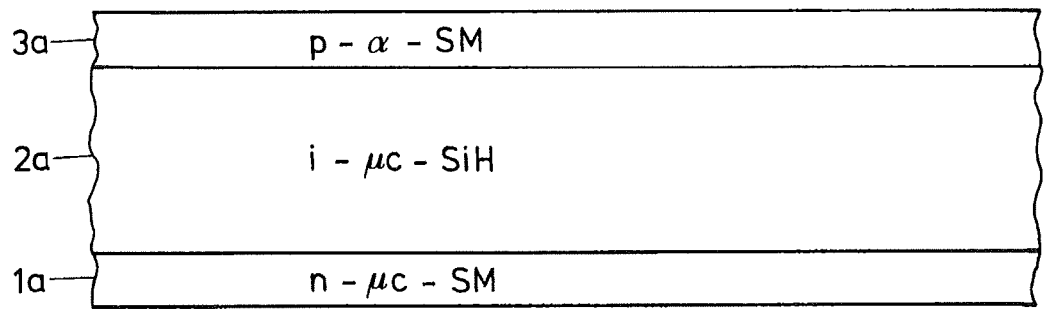
Figure 4:
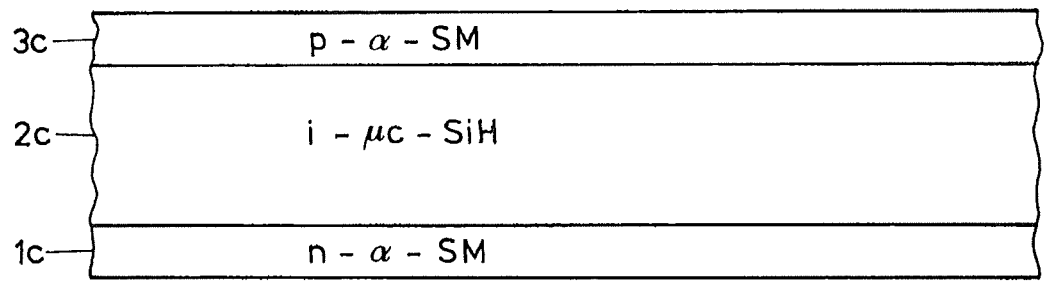
Figure 5:
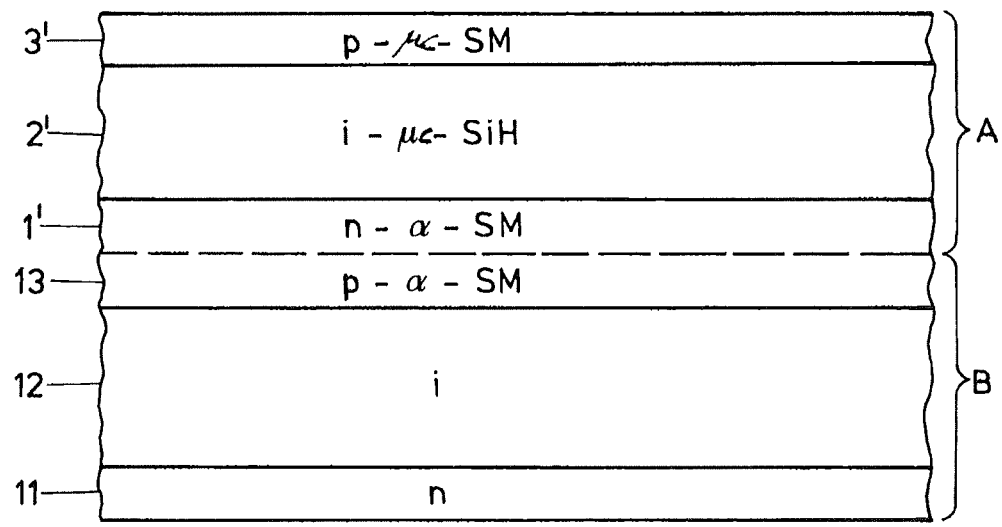
Figure 6:
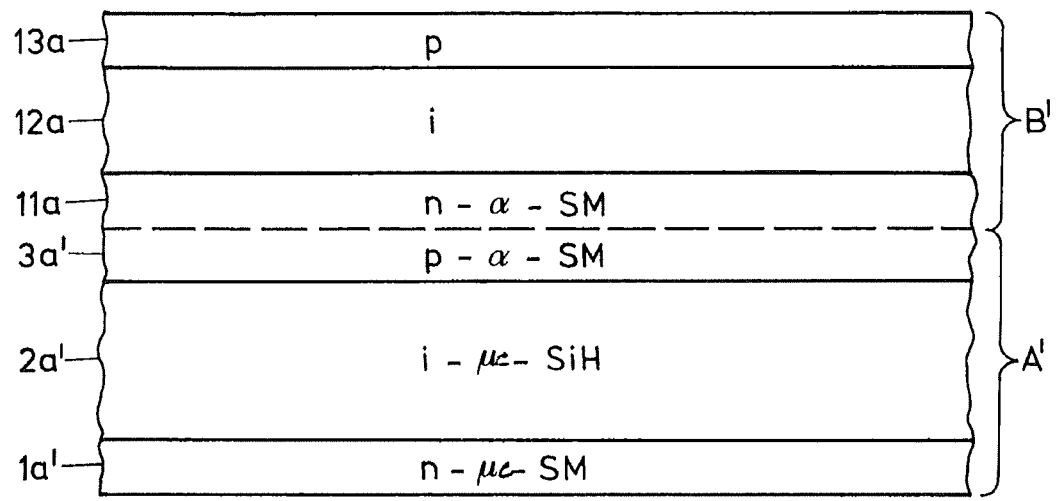
Figure 7:
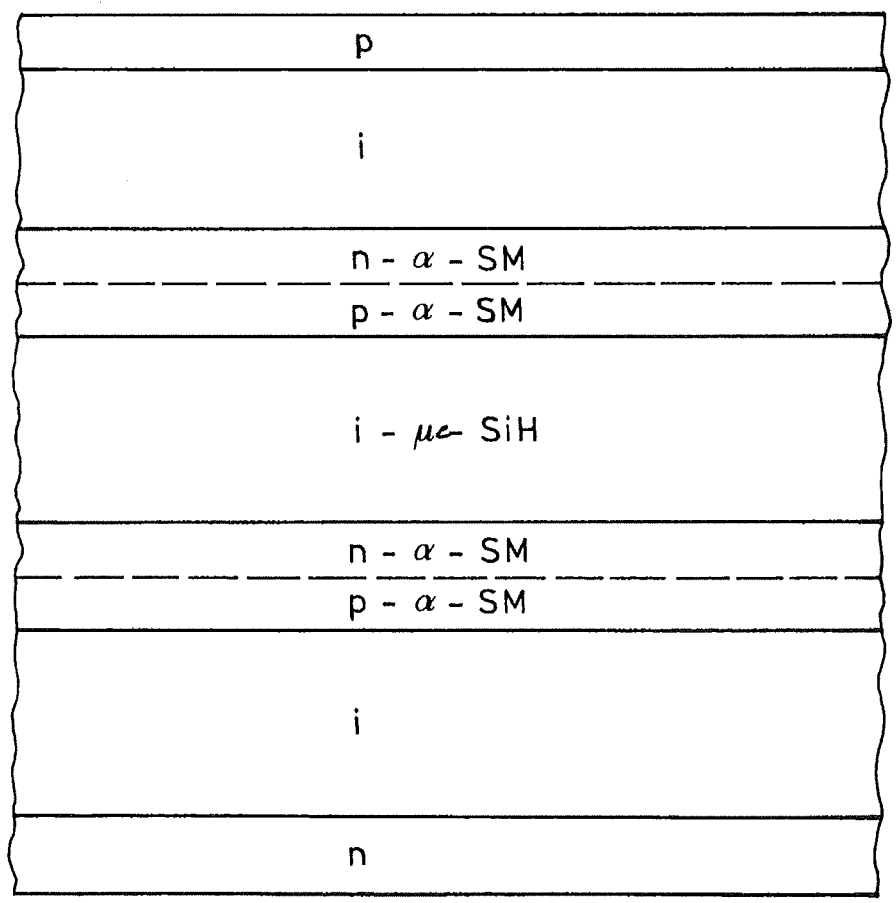

The present invention shall now be further described by specific examples and with the help of figures. The figures show:

FIG. 1 Purely schematically, the layer structure of a photovoltaic cell on a converter panel according to the present invention and manufactured by a method according to the invention, comprising a microcrystalline-p-semiconductor-material layer, a microcrystalline intrinsic layer of a semiconductor compound and an amorphous n-layer of semiconductor material;

FIG. 2 schematically, the characteristics of dopant concentration and material structure at an interface between an amorphous layer of doped semiconductor material and a microcrystalline layer of intrinsic semiconductor compound;

FIG. 3 in a representation according to that of FIG. 1, the layer structure comprising an amorphous layer of p-doped semiconductor material, a microcrystalline layer of intrinsic silicon compound and a microcrystalline layer of intrinsic semiconductor material;

FIG. 4 still in a representation according to that of FIG. 1 or 3, the layer structure comprising a amorphous layer of p-doped semiconductor material, a microcrystalline layer of intrinsic semiconductor compound and an amorphous layer of n-doped semiconductor material;

FIG. 5 still in a representation according to those of FIG. 1, 3 or 4, the layer structure of a tandem cell, whereat the amorphous layer of n-doped semiconductor material of a first cell according to FIG. 1 is integral with the subsequent amorphous layer of p-doped semiconductor material of a second cell stacked upon the first cell;

FIG. 6 in a representation according to that of FIG. 5, a tandem cell, whereat the amorphous layer of p-doped semiconductor material of a first cell according to FIG. 3 is integral with the subsequent amorphous layer of n-doped semiconductor material of a second cell stacked upon the first cell;

FIG. 7 in a representation in analogy to those of the FIGS. 5 and 6, an arrangement of triple stacked cells, whereat departing from a cell according to FIG. 4 their respective amorphous n-doped and p-doped amorphous layers of semiconductor material transit integral into the respective n-doped and p-doped amorphous layers of semiconductor material of the adjacent stacked two cells.

At first, it must be pointed out that:
(a) Today it is hardly possible to deposit a high quality intrinsic microcrystalline layer of a semiconductor material which suffices the requirements for efficient photovoltaic conversion upon a base material which is not microcrystalline by CVD of PECVD. Nevertheless and was addressed above, it is not excluded that this may become possible in the near future.
(b) It has been addressed that band gap considerations and thus spectral absorption characteristics of the layers staggered one upon the other in direction of transiting light is to be taken into account. This has led in today's technology to provide amorphous layers upstream microcrystalline layers. Nevertheless it may not be excluded that the addressed physical considerations necessarily lead to the addressed staggering of amorphous and microcrystalline layers.

In view of the fact that neither of the today's valid considerations as outlined under (a) and (b) do in fact influence the generic concept of the present invention, namely to improve large scale industrial manufacturing by exploiting respective advantages of amorphous layer deposition over microcrystalline layer deposition wherever possible, we address the invention without considerations as to (a) and (b), also in view, that such considerations might become less restrictive by future development.

In FIG. 1 there is shown in a schematic representation a section out of a photovoltaic converter panel as of the present invention comprising at least one photovoltaic cell manufactured according to the present invention.

The photovoltaic cell comprises a microcrystalline layer as a second layer 2 substantially of silicon compound, specifically of hydrogenated silicon SiH. The layer material is neutrally doped or undoped, which is addressed by the term "intrinsic". The microcrystalline intrinsic layer 2 is sandwiched between layers 1 and 3 which are respectively p- and n-doped and at least substantially consist of semiconductor material thereby more specifically comprise or substantially consist of silicon compound, even more specifically of hydrogenated silicon. Thereby and under generic considerations the two layers 1 and 3 may be of different materials.

According to the embodiment of FIG. 1 one of the doped layers, namely layer 3 which is p-doped, is a microcrystalline layer, whereas the second of the doped layers, layer 1, is an amorphous layer. Thereby in a specific embodiment where both layers 1 and 3 substantially consist of hydrogenated silicon, the thicknesses $d_1$, $d_3$ of the respective doped layers 1 and 3 are of at most 30 nm, specifically of at most 10 nm, whereas the thickness of the microcrystalline layer 2 which is intrinsic and thus establishes for the photovoltaically active layer, $d_2$, is in the range of $$100 \text{ nm} \leq d_2 \leq 10 \text{ μm}$$

more specifically of $$0.5 \text{ μm} \leq d_2 \leq 2 \text{ μm}.$$

As addressed under a generic approach the semiconductor material of the doped layers 1 and 3 may be selected according to specific manufacturing and physical needs and the material of the microcrystalline layer 2 may comprise further elements not acting as a dopant, e.g. for specifically tailoring absorption and thus transmission characteristics of the addressed material with respect to sunlight.

The layers of the cell according to the embodiment of FIG. 1 and under consideration of today's knowledge as outlined under (a) are deposited in the following sequence:

First there is deposited upon a substrate surface the microcrystalline layer 3 so as to form an optimum base for subsequent deposition of the microcrystalline i-layer 2. Finally, the n-doped layer 1 is deposited upon the microcrystalline i-layer 2 as an amorphous layer. Thereby, the deposition rate for the amorphous doped layer 1, is considerably larger than the deposition rate of the same semiconductor material doped layer as a microcrystalline layer. Further as known to the skilled artisan stability and controllability of the vacuum deposition process for such amorphous layer is less critical than for depositing silicon a respective layer as a microcrystalline layer and, additionally, power consumption for the deposition of the amorphous layer is lower than for depositing a respective microcrystalline layer.

EXAMPLE

A substrate of e.g. 1 m2 of a glass with a thickness of 3 mm, one side coated with a transparent electrode layer of an electrically conducting oxide, e.g. of ZnO or SnO2 or ITO2 was introduced in a vacuum processing chamber, after laser patterning the layer of electrically conductive oxide according to the intended pattern of photovoltaic cells on the converter panel.

The chamber had been cleaned before with the help of a hydrogen Rf plasma. After cleaning the vacuum chamber and before introducing the addressed substrate the vacuum chamber was evacuated to $10^{-2}$ mbar. The substrate was deposited with its uncoated surface on one of the two electrodes of the parallel electrode PECVD processing vacuum chamber.

p-doped microcrystalline layer 3:

For realizing a photovoltaic converter with photovoltaic cells as of the embodiment according to FIG. 1, first the p-doped microcrystalline layer 3 of hydrogenated silicon was deposited. To do so the following processing parameters were established:

Operating frequency of the ignited plasma: 40 MHz
Rf power of the plasma discharge per unit of substrate surface: in the order of 0.1 W/cm$^2$
Reactive gas: Hydrogen, Silane and Trimethylboron as a p-dopant.
Total pressure: 2.5 mbar
Deposition rate: 1 Å/sec.

The substrate being coated had a temperature in the range of 150° C. to 220° C.

As a reactive gases, in the present case Hydrogen, Silane and Trimethylboron, were used purified with respect to oxygen content as today best possible. This primarily to avoid already during deposition of the addressed p-doped layer oxygen contamination of the vacuum chamber.

After about 3 min. a p-doped microcrystalline layer of hydrogenated silicon was deposited upon the transparent electrically conductive oxide layer of the substrate with a thickness $d_3$ of about 20 nm.

Subsequently the inflow of p-dopant gas, Trimethylbor, was stopped and the following processing parameters changed to establish:

Microcrystalline intrinsic layer 2:
Operating frequency of the plasma: 40 MHz
Rf power of the plasma discharge per unit of substrate surface: in the order of 0.1 W/cm$^2$
Reactive gas: Hydrogen, Silane
Total pressure: 2.5 mbar
Deposition rate: in the range of 5-6 Å/sec
The substrate being coated had a temperature in the range of 150° C. to 220° C.

After about less than 1.5 h a microcrystalline intrinsic layer 2 with a thickness $d_2$ of about 1 μm had been deposited on the microcrystalline p-doped layer 3.

n-doped amorphous layer 1:
Thereafter the n-doped amorphous layer 1 of hydrogenated silicon was deposited upon the microcrystalline intrinsic layer 2 as follows:
Operating frequency of the plasma: 40 MHz
Rf power of the plasma discharge per unit of substrate surface: in the order of 0.01 W/cm$^2$
Reactive gas: Hydrogen, Silane, Phosphine as n-dopant.
Total pressure: 0.5 mbar
Deposition rate: in the range of 2-3 Å/sec
The substrate being coated had a temperature in the range of 150° C. to 220° C.

Thereby, an amorphous n-doped layer 1 of hydrogenated silicon was deposited, with a thickness $d_1$ of about 20 nm in 1.5 min.

Then the resulting p-i-n cell layers where laser patterned, a back contact layer was applied and the back contact layer as well as the p-i-n cell layers subjected to a further laser patterning.

More generically the following was recognized:

|  | microcrystalline |  | amorphous |  |
| --- | --- | --- | --- | --- |
|  | Undoped (ref.) | doped | undoped | doped |
| Deposition rate | $a_o$ | $\leq 0.2\, a_o$ | $\geq 0.4\, a_o$ | $\geq 0.4\, a_o$ |
| power | $p_o$ | $p_o$ | $\leq 0.3\, p_o$ | $\leq 0.3\, p_o$ |

Taking microcrystalline undoped layer deposition as a reference one may see, that deposition of an amorphous layer which is doped may be done with significantly higher deposition rate compared with depositing a microcrystalline doped layer (factor of at least 2) and that additionally the power may be significantly reduced (factor of at least 3).

These considerations kept in mind, further embodiments of the manufacturing method and of the converter panel according to the present invention shall be addressed by examples:

In FIG. 2 there is shown heuristically and without any claim for scientific accuracy the characteristics at the interface between a microcrystalline intrinsic semiconductor layer and an amorphous doped layer as between layers 2 and 1 of FIG. 1.

According to FIG. 2 the coordinate axis x denotes the transition direction from one layer to the other as introduced in FIG. 1. Up to the surface of the i-layer denoted by I in FIG. 2 the structure of the i-layer is microcrystalline. When depositing doped semiconductor material on that surface I under process conditions which finally lead to deposition of an amorphous layer, there is generated an interface region denoted by line II in FIG. 2 along which the purely microcrystalline structure μc steadily turns in the amorphous structure α.

Further, in the bulk of the amorphous layer there is present a predetermined concentration of dopant e.g. n-dopant. In contrary thereto and as shown in the region of the microcrystalline intrinsic layer left-hand of I in FIG. 2, in the bulk of the intrinsic layer there is no such dopant. Due to the high concentration gradient of dopant there occurs diffusion of dopant into the microcrystalline structure of the intrinsic layer as shown by line III. The two phenomena, namely change of microcrystallinity to amorphousness when depositing the amorphous layer according to line II of FIG. 2 and of diffusion of the dopant from the amorphous layer into the microcrystalline intrinsic layer may be of different weight for generation of an interlayer along the interface between the microcrystalline and the amorphous layers. This interlayer is represented in FIG. 2 by the area IL. Therefore, it might be seen that along the interface there is generated an interlayer which is, considered in direction x, of decreasing microcrystallinity and increasing density of the dopant, resulting in such interlayer IL being of microcrystalline structure and being doped with the dopant of the amorphous layer. The thickness dIL of such interlayer may be controlled by control of process parameters, e.g. by control of deposition temperature. Although, even at very low temperatures or other unfavorable conditions for dopant diffusion as e.g. low pressure or low gradient and/or by using current deposition techniques, the addressed phenomena may never totally disappear, although becoming difficult to measure and/or to distinguish.

Thus, by deposition of an amorphous and doped semiconductor layer upon the intrinsic microcrystalline layer substantially of a silicon compound as specifically of hydrogenated silicon, there is generated a microcrystalline interlayer which is doped with the dopant of the amorphous layer. In this simplified consideration the effect along the interface which is due to applying the intrinsic and the amorphous layers of different semiconductor materials is not addressed.

As may be perfectly understood by the skilled artisan the embodiment of FIG. 3 is analogous to that of FIG. 1. Instead of depositing the n-doped layer as an amorphous layer, in the embodiment of FIG. 3 the p-doped layer is deposited as an amorphous layer. Therefore and under the today's prevailing boundary conditions as of (a) the sequence of deposition of the layers of the photovoltaic cell according to the embodiment of FIG. 3 is:

Deposition of the n-doped semiconductor layer 1a as a microcrystalline layer on a substrate (not shown), deposition of the intrinsic microcrystalline layer 2a and deposition of the p-doped layer 3a as an amorphous layer.

In the embodiment according to FIG. 4 the general approach according to the present invention is shown, if the today prevailing restriction according to (a) is overcome and it becomes possible, e.g. by respective process control, to deposit the intrinsic microcrystalline layer upon the surface of a not-microcrystalline material. Then both layers which are doped, namely the p-doped layer 3c as well as the n-doped layer 1c, are both deposited as amorphous layers of respective semiconductor material.

In the today's embodiment of the photovoltaic cell according to FIG. 1 or 3 both doped layers 3, 3a and 1, 1b, are deposited substantially of the same semiconductor material as the intrinsic layer 2, 2a, namely substantially of silicon compound thereby specifically of hydrogenated silicon.

The layers are deposited by means of a PECVD process with a plant as e.g. shown in FIG. 1 of the EP 0 871 979.

With the help of the FIGS. 5-7 further embodiments according to the present invention shall be exemplified, whereat the at least one doped layer of the photovoltaic cell with microcrystalline intrinsic layer of silicon compound, specifically of hydrogenated silicon, is further exploited to directly build up a respective inversely doped amorphous layer of a subsequent photovoltaic cell.

In the embodiment as schematically shown in FIG. 5 three layers 1' to 3' accord with the respective layers 1 to 3 of the embodiment of FIG. 1. These three layers form thus the photovoltaic cell A as of FIG. 1.

Nevertheless, within the amorphous n-doped semiconductor layer 1' the dopant type is changed. This may e.g. be realized by gradually reducing the content of negative dopant gas and increasing the content of positive dopant gas when depositing the layer 1'/13. There thus results a layer 13 which is amorphous and p-doped and is integral with the n-doped amorphous semiconductor layer 1'. There follows an intrinsic amorphous or microcrystalline semiconductor layer 12, followed by an n-doped microcrystalline or amorphous semiconductor layer 11 so as to form the second photovoltaic cell B in tandem configuration with the cell A.

FIG. 6 shows in analogy to FIG. 5 a tandem cell, whereat the amorphous layer 3a', positively doped, is integral with layer 11a of additional cell B' which is n-doped.

As now clear to the skilled artisan, FIG. 7 shows a triple cell, in which a cell according to FIG. 4 is sandwiched between two additional cells following the principal as exemplified by the FIGS. 5 and 6.

The invention claimed is:

1. A method for large-scale industrial manufacturing of photovoltaic cells for a photovoltaic converter panel of at least 2500 cm$^2$ surface extent, comprising depositing a first layer substantially of first type doped semiconductor material by means of a vacuum deposition process, depositing a third layer substantially of second type doped semiconductor material by means of a vacuum deposition process and, in between said first layer and said third layer as second layer, depositing by means of a vacuum deposition process in an atmosphere containing at least one reactive gas a neutrally or undoped microcrystalline layer substantially of silicon compound wherein at least one of depositing of said first and of depositing of said third layer comprises depositing of an amorphous layer of respectively doped semiconductor material, the method further comprising depositing by means of a vacuum deposition process a fourth layer substantially of first type doped semiconductor material, depositing by means of a vacuum deposition process a sixth layer substantially of second type doped semiconductor material and, in between said fourth layer and said sixth layer, as a fifth layer, depositing by means of a vacuum deposition process a neutrally doped or undoped semiconductor layer, wherein said depositing of said first layer comprises said depositing of an amorphous layer of first type doped semiconductor material and depositing of said sixth layer comprises continuing depositing of said first layer by the respective vacuum deposition process while changing said first type doping to said second type doping.

2. The method of claim 1 wherein said silicon compound comprises hydrogenated silicon.

3. The method of claim 1 comprising depositing by a vacuum deposition process a first further layer substantially of first type doped semiconductor material, depositing by a vacuum deposition process a third further layer substantially of second type doped semiconductor material and, in between, as a second further layer, depositing by a vacuum deposition process a neutrally or undoped semiconductor layer, wherein said depositing of said third layer comprises said depositing of an amorphous layer of second type doped semiconductor material and depositing of said first further layer comprises continuing deposition of said third layer by said respective vacuum deposition process while changing said second type doping to said first type doping.

4. The method of claim 1, wherein deposition of the at least one of said first and of said third layers is performed by a vacuum deposition process in an atmosphere containing at least one reactive gas and comprises depositing of a respectively doped silicon compound.

5. The method of claim 4 said silicon compound comprising hydrogenated silicon.

6. The method of claim 1, wherein said at least one layer is deposited as an amorphous respectively doped layer comprising a silicon compound by a vacuum deposition process in an atmosphere containing at least one reactive gas.

7. The method of claim 6 said silicon compound comprising hydrogenated silicon.

8. The method of claim 1 comprising forming a respectively doped microcrystalline interlayer adjacent to said second layer by said depositing of said at least one amorphous layer of respectively doped semiconductor material.

9. The method of claim 1 wherein said at least one layer is deposited upon said second layer.

* * * * *